United States Patent
Kato et al.

(10) Patent No.: US 10,366,938 B2
(45) Date of Patent: Jul. 30, 2019

(54) SILICON NITRIDE CIRCUIT BOARD AND ELECTRONIC COMPONENT MODULE USING THE SAME

(71) Applicants: KABUSHIKI KAISHA TOSHIBA, Tokyo (JP); TOSHIBA MATERIALS CO., LTD., Yokohama-Shi, Kanagawa-Ken (JP)

(72) Inventors: Hiromasa Kato, Nagareyama Chiba (JP); Noboru Kitamori, Miura Kanagawa (JP); Takayuki Naba, Chigasaki Kanagawa (JP); Masashi Umehara, Yokohama Kanagawa (JP)

(73) Assignees: Kabushiki Kaisha Toshiba, Tokyo (JP); Toshiba Materials Co., Ltd., Yokohama-shi (JP)

( * ) Notice: Subject to any disclaimer, the term of this patent is extended or adjusted under 35 U.S.C. 154(b) by 0 days.

(21) Appl. No.: 16/123,033

(22) Filed: Sep. 6, 2018

(65) Prior Publication Data
US 2019/0006261 A1    Jan. 3, 2019

Related U.S. Application Data

(63) Continuation of application No. 15/548,035, filed as application No. PCT/JP2016/052190 on Jan. 26, 2016, now Pat. No. 10,109,555.

(30) Foreign Application Priority Data

Feb. 2, 2015   (JP) ................................ 2015-018515

(51) Int. Cl.
*H01L 23/373*   (2006.01)
*H01L 21/48*    (2006.01)
(Continued)

(52) U.S. Cl.
CPC ...... *H01L 23/3735* (2013.01); *H01L 21/4807* (2013.01); *H05K 1/0271* (2013.01); *H05K 1/0306* (2013.01); *H01L 23/562* (2013.01)

(58) Field of Classification Search
CPC ..................... H01L 21/4807; H01L 23/3735
See application file for complete search history.

(56) References Cited

U.S. PATENT DOCUMENTS

| 2002/0084103 A1 | 7/2002 | Komatsu et al. |
| 2003/0224199 A1 | 12/2003 | Nakamura et al. |

(Continued)

FOREIGN PATENT DOCUMENTS

| EP | 1345480 A2 | 9/2003 |
| JP | H11-330308 A | 11/1999 |

(Continued)

OTHER PUBLICATIONS

International Search Report and Written Opinion of the International Searching Authority issued in corresponding International Application No. PCT/JP2016/052190, dated Apr. 12, 2016, with English translation.

*Primary Examiner* — Elias Ullah
(74) *Attorney, Agent, or Firm* — Harness, Dickey & Pierce, PLC

(57) ABSTRACT

The present invention provides a silicon nitride circuit board in which metal plates are attached on front and rear sides of a silicon nitride substrate having a three-point flexural strength of 500 MPa or higher, wherein assuming that a thickness of the metal plate on the front side is denoted by t1, and a thickness of the metal plate on the rear side is denoted by t2, a numerical relation: $|t1-t2| \geq 0.30$ mm is satisfied, and a warp is formed in the silicon nitride substrate so that the silicon nitride substrate is convex toward the metal plate on one of the front side or the rear side; and warp amounts of the silicon nitride substrate in a long-side (Continued)

direction and a short-side direction both fall within a range from 0.01 to 1.0 mm. It is preferable that a longitudinal width (L1) of the silicon nitride substrate falls within a range from 10 to 200 mm, and a transverse width (L2) of the silicon nitride substrate falls within a range from 10 to 200 mm. Due to above structure, even if the silicon nitride circuit board has a large difference in thickness between the metal plates attached on front and rear sides of the silicon nitride substrate, TCT properties can be greatly improved.

13 Claims, 6 Drawing Sheets

(51) Int. Cl.
*H05K 1/02* (2006.01)
*H05K 1/03* (2006.01)
*H01L 23/00* (2006.01)

(56) References Cited

U.S. PATENT DOCUMENTS

| | | |
|---|---|---|
| 2009/0056996 A1 | 3/2009 | Kato et al. |
| 2011/0017496 A1 | 1/2011 | Hayashi et al. |
| 2012/0305304 A1 | 12/2012 | Kato et al. |
| 2014/0291699 A1 | 10/2014 | Yano et al. |
| 2015/0034367 A1 | 2/2015 | Nagatomo et al. |

FOREIGN PATENT DOCUMENTS

| | | |
|---|---|---|
| JP | 2003-168770 A | 6/2003 |
| JP | 2004-014589 A | 1/2004 |
| JP | 3797905 B2 | 4/2006 |
| JP | 2007-230791 A | 9/2007 |
| JP | 2010-118682 A | 5/2010 |
| JP | 2011-091184 A | 5/2011 |
| JP | 2012-023404 A | 2/2012 |
| JP | 2013-065918 A | 4/2013 |
| JP | 2014-222788 A | 11/2014 |
| WO | WO-2007-105361 A1 | 9/2007 |

SILICON NITRIDE CIRCUIT BOARD AND ELECTRONIC COMPONENT MODULE USING THE SAME

CROSS-REFERENCE TO RELATED APPLICATIONS

This application is a continuation of U.S. patent application Ser. No. 15/548,035 filed Aug. 1, 2017 (now U.S. Pat. No. 10,109,555, issued Oct. 23, 2018), which is a U.S. National Phase Application under 35 U.S.C. 371 of International Application No. PCT/JP2016/052190 filed on Jan. 26, 2016 and published in Japanese as WO 2016/125635 on Aug. 11, 2016, and which claims the benefit of priority from Japanese Patent Application No. 2015-018515 filed Feb. 2, 2015. The entire disclosures of all of the above applications are incorporated herein by reference.

DESCRIPTION

Technical Field

An embodiment described herein generally relates to a silicon nitride circuit board and an electronic component module using the silicon nitride circuit board.

Background Art

In recent years, development of high power modules such as high-power high-efficiency inverters has been underway with an increase in performance of industrial equipment such as robots and motors. In proportion to outputs of high power modules, heat generated from semiconductor elements is steadily increasing. To dissipate (radiate) the heat efficiently, various methods are adopted for high power modules. Recently, use has been made of a ceramic circuit board including metal plates attached and bonded on both sides of a ceramic substrate.

As the ceramic circuit board, the circuit boards described in WO 2007/105361 (Patent Document 1), Japanese Patent Laid-Open No. 2010-118682 (Patent Document 2) are developed. According to Patent Document 1, an improved TCT property (thermal cycling resistance property; thermal cycle test property) is given by performing control of a thickness ratio between a metal plate on a front side (first metal plate) and a metal plate on a rear side (second metal plate) to 50% or larger and 200% or smaller.

According to Patent Document 2, a ceramic circuit board that warps so as to be convex toward a metal plate on a front side (on a metal circuit plate side) is developed. According to Patent Document 2, by adopting such a structure, an improved solder flow property is given. By adopting the structures of the ceramic circuit boards as described in Patent Document 1 and Patent Document 2, a TCT property and a solder flow property are improved.

In accordance with an increase in power of semiconductor elements, a further improvement of a heat dissipation property has been demanded. In a semiconductor module, a semiconductor element is mounted on a ceramic circuit board through a solder layer interposed therebetween. In such a module structure, a heat transfer path is as follows: semiconductor element→solder layer→metal plate (metal plate on the front side)→ceramic substrate→metal plate (metal plate on the rear side). One of indexes indicating a heat dissipation property of a ceramic circuit board is thermal resistance. A lower thermal resistance indicates a better heat dissipation property.

A thermal resistance (Rth) is determined as $Rth=H/(k\times A)$. Here, a symbol H represents heat transfer path, k represents thermal conductivity, and A represents heat dissipation area. As is clear from the above calculation expression, decreasing the thermal resistance (Rth) involves shortening the heat transfer path (H), increasing the thermal conductivity (k), and increasing the heat dissipation area (A).

Moreover, improvement of a TCT (thermal cycle test) property is also demanded for ceramic circuit boards. According to Japanese Patent No. 3797905 (Patent Document 3), a silicon nitride substrate having a three-point flexural strength of 500 MPa or higher is developed. Use of a silicon nitride substrate having a high flexural strength (bending strength) allows the improvement of the TCT property.

To cope with the increase in power mentioned before, further improvement of the heat dissipation property and the TCT property have been demanded. To improve the heat dissipation property by using a high-strength silicon nitride substrate, it is effective to increase the heat dissipation area (A). To shorten the heat transfer path (H), it is effective to reduce thicknesses of a metal circuit plate and a ceramic substrate.

However, an excessive reduction of the thickness of a metal circuit plate makes it difficult to flow large current. An excessive reduction of the thickness of a ceramic substrate causes concern about an insulation property. As to the thermal conductivity (k), an aluminum nitride substrate having a thermal conductivity to a degree of 250 W/m·K is developed. However, such the aluminum nitride substrate has a strength of only about 250 MPa and thus is poor in TCT property.

Examples of effective methods to increase the heat dissipation area (A) include a method to enlarge a metal plate to be attached to a ceramic substrate, and a method to attach a leadframe, a heat sink, and the like.

PRIOR ART DOCUMENTS

Patent Documents

Patent Document 1: International Publication No. WO 2007/105361
Patent Document 2: Japanese Patent Laid-Open No. 2010-118682
Patent Document 3: Japanese Patent No. 3797905

SUMMARY OF THE INVENTION

Problems to be Solved by the Invention

According to [Table 1] of Patent Document 1, while the thickness ratio between the metal plates on the front side and the rear side is changed to a range from 50 to 250%, a silicon nitride circuit board having a good TCT property is not obtained when a difference in thickness between the front and rear metal plates becomes large, being 0.30 mm or larger. According to [Table 1] of Patent Document 2, a solder flow property is improved by controlling a warp amount of a silicon nitride substrate in a long-side direction. However, Patent Document 2 provides no sufficient study about a case where the difference in thickness between the front and rear metal plates becomes large, being 0.30 mm or larger.

Furthermore, a conventional silicon nitride circuit board involves a problem in that the silicon nitride circuit board bends when a leadframe or the like having a thickness of 0.4 mm or larger is attached to increase the heat dissipation area (A).

An objective to be achieved by the present invention is to provide a silicon nitride circuit board that is good in TCT property even when metal plates are attached on front and rear sides thereof, a difference in thickness between the metal plates being 0.30 mm or larger. In addition, the present invention provides a silicon nitride circuit board that does not bend even when a leadframe or the like having a thickness of 0.4 mm or larger are attached thereto.

Means for Solving the Problems

The silicon nitride circuit board according to an embodiment is a silicon nitride circuit board in which metal plates are attached on front and rear sides of a silicon nitride substrate having a three-point flexural strength of 500 MPa or higher, wherein assuming that a thickness of the metal plate on the front side is denoted by t1, and a thickness of the metal plate on the rear side is denoted by t2, $|t1-t2|\geq 0.30$ mm is satisfied, the silicon nitride substrate warps so as to be convex toward the metal plate on one of the front side or the rear side, and warp amounts of the silicon nitride substrate in a long-side direction and a short-side direction both fall within a range from 0.01 to 1.0 mm.

DESCRIPTION OF EMBODIMENT

Figure 1:
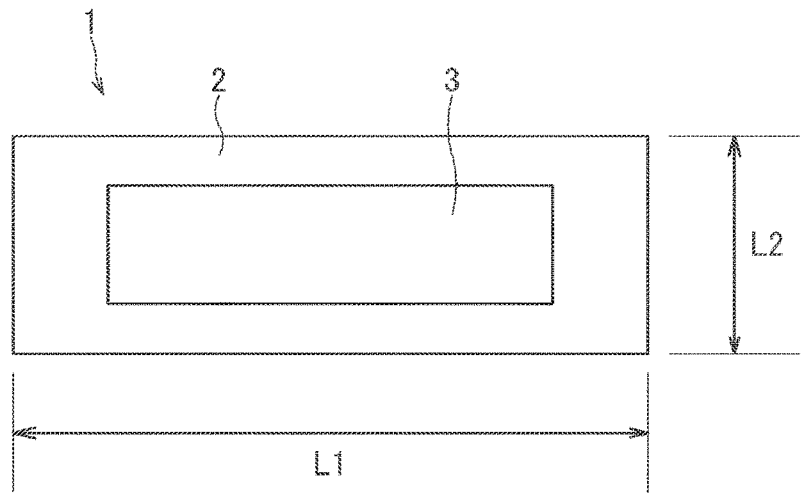
FIG. 1 is a top view illustrating an example of a silicon nitride circuit board according to an embodiment.

The silicon nitride circuit board according to an embodiment is a silicon nitride circuit board in which metal plates are attached on front and rear sides of a silicon nitride substrate having a three-point flexural strength of 500 MPa or higher, wherein assuming that a thickness of the metal plate on the front side is denoted by t1, and a thickness of the metal plate on the rear side is denoted by t2, a numerical relation: $|t1-t2|\geq 0.30$ mm is satisfied, a warp is formed in the silicon nitride substrate so that the silicon nitride substrate is convex toward the metal plate on one of the front side or the rear side, and warp amounts of the silicon nitride substrate in a long-side direction and a short-side direction both fall within a range from 0.01 to 1.0 mm.

The silicon nitride substrate is one having a three-point flexural strength (three-point bending strength) of 500 MPa or higher. When the three-point flexural strength is as low as less than 500 MPa, a TCT property of the silicon nitride substrate decreases. The three-point flexural strength is preferably 500 MPa or higher, further, 600 MPa or higher. The silicon nitride substrate preferably has a fracture toughness value of 6.0 MPa·m$^{1/2}$ or higher.

The silicon nitride substrate preferably has a thermal conductivity of 50 W/m·K or higher. The thermal conductivity is preferably 50 W/m·K or higher, further 80 W/m·K or higher. Increasing the thermal conductivity allows a thermal resistance of the silicon nitride circuit board to be lowered.

The silicon nitride substrate preferably has a thickness of 0.70 mm or smaller. Further, a thickness reduction down to 0.33 mm or smaller, or 0.26 mm or smaller, is preferably performed. The silicon nitride substrate is high-strength and excellent in insulation property, which enables the thickness reduction of the substrate. Performing the thickness reduction of the substrate allows the thermal resistance of the circuit board to be lowered. The lower limit of the thickness of the silicon nitride substrate is preferably 0.10 mm or larger. If the substrate has a thickness as small as less than 0.10 mm, it may be difficult to secure the strength and insulation property of the silicon nitride substrate.

On both sides of the silicon nitride substrate, metal plates are attached. The metal plates are preferably copper plates, aluminum plates, copper alloy plates, or aluminum alloy plates. A method for the attachment may be one in which attachment layers (bonding layers) are interposed between the silicon nitride substrate and the metal plates, respectively, or one in which the metal plates are directly attached to the silicon nitride substrate with no attachment layers interposed therebetween. The method for the attachment using the attachment layers interposed is preferably an active metal attaching method in which an active metal brazing material is used.

The active metal brazing material preferably comprises silver (Ag), copper (Cu), and titanium (Ti). Moreover, tin (Sn) and indium (In) are supposed to be added to the active metal brazing material as necessary. Examples of the active metal brazing material include one that contains 40 to 80% by mass of Ag, 20 to 60% by mass of Cu, 0.1 to 10% by mass of Ti, 20% by mass or less (0 included) of Sn, and 20% by mass or less (0 included) of In. In a case where the metal plates are copper plates or copper alloy plates, the attachment is made easier by the active metal attaching method.

In a case where the metal plates are Al plates or Al alloy plates, Al (aluminum) is an active metal. Examples of a component other than the active metal include Si (silicon). Examples of an active metal brazing material in this case is one that contains 0.01 to 10% by mass of Si, and Al as the remainder.

Assuming that, among the metal plates attached on the front and rear sides, the metal plate on the front side has a thickness of t1, and the metal plate on the rear side has a thickness of t2, $|t1-t2|\geq 0.30$ mm is to be satisfied. The satisfaction of |t1−t2|≥0.30 mm indicates that a difference in thickness between the metal plate on the front side and the metal plate on the rear side is 0.30 mm or larger. Any one of the metal plates on the front side and the rear side may be thicker than another one. The metal plate on the front side is preferably a metal plate on which a semiconductor element is mounted, and the metal plate on the rear side is preferably a heat dissipation plate.

In order to give an additional current-carrying capacity, the metal plate on the front side is preferably increased in thickness. In contrast, in order to provide a good heat dissipation property, the metal plate on the rear side is preferably increased in thickness. In addition, t1≥0.20 mm and t2≥0.20 mm are preferably established. In order to satisfy |t1−t2|≥0.30 mm, any one of t1 and t2 is preferably 0.50 mm or larger.

The upper limit of the thicknesses of the metal plates is not particularly limited. However, it preferably be 5.00 mm or smaller. A thickness of the metal plates exceeding 5.00 mm results in an increase in volume change caused by thermal expansion of the metal plates, which makes it difficult to control a warp amount to be described later. In addition, 3.00 mm≥|t1−t2|≥0.30 mm is preferably established. Within this range, the warp amount to be described later is easy to control.

The silicon nitride substrate warps so that the metal plate attached on one of the front side and the rear side is convex. A feature of the silicon nitride substrate is that, in this state, warp amounts in both of a long-side direction and a short-side direction fall within a range from 0.01 to 1.0 mm.

As will be described later, in a case where a leadframe is attached to a front-side metal plate, a convex warp is preferably present on the rear side. In a case where a heat sink or a cooling fin is attached to a rear-side metal plate, a convex warp is preferably present on the front side. In a case where a leadframe is attached to the front-side metal plate, and a heat sink (or a cooling fin) is attached to the rear-side metal plate, a convex warp is preferably present on the rear side.

Figure 2:
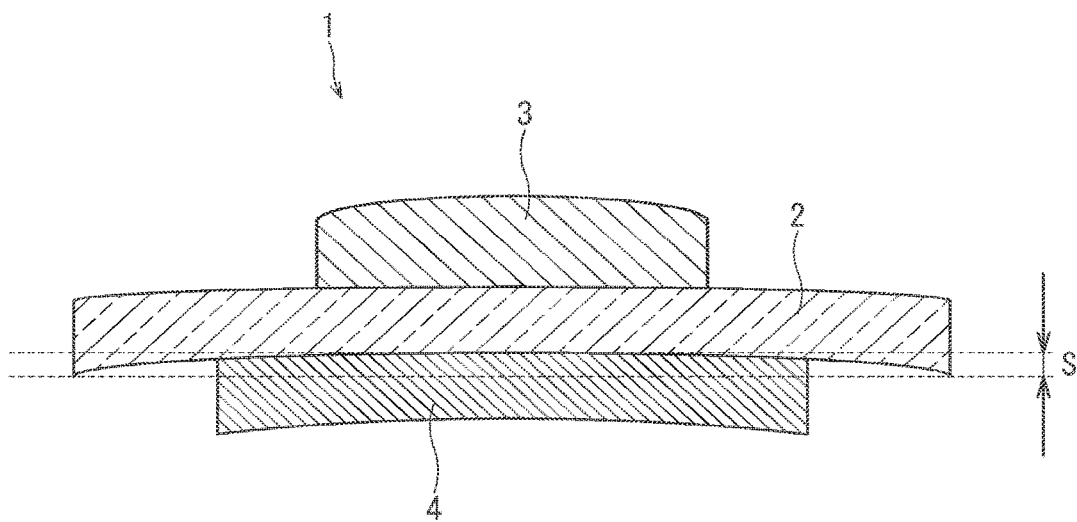
FIG. 2 is a lateral cross sectional view illustrating an example of the silicon nitride circuit board according to the embodiment.
Figure 3:
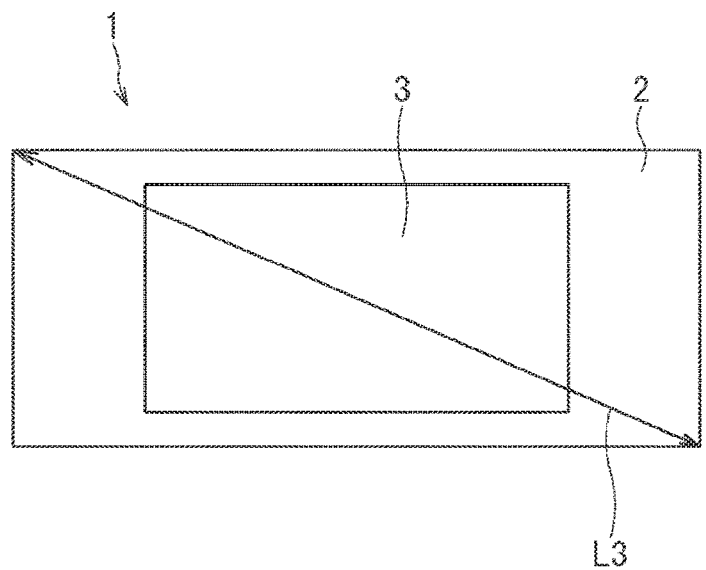
FIG. 3 is a top view illustrating an example of a length of a diagonal line of the silicon nitride circuit board according to the embodiment.

FIG. 1, FIG. 2, and FIG. 3 illustrate an example of the silicon nitride circuit board according to the embodiment. FIG. 1 and FIG. 3 are top views, and FIG. 2 is a lateral cross sectional view. In the drawings, reference numeral 1 denotes the silicon nitride circuit board, reference numeral 2 denotes the silicon nitride substrate, reference numeral 3 denotes the metal plate on the front side, and a metal plate 4 denotes the metal plate on the rear side.

Reference character L1 denotes a length of the silicon nitride substrate in a long-side direction (longitudinal width), reference character L2 denotes a length of the silicon nitride substrate in a short-side direction (transverse width), reference character L3 denotes a length of the silicon nitride substrate in a diagonal line direction, and reference character S denotes a warp amount of the silicon nitride substrate. A warp amount of the silicon nitride substrate in the long-side direction is denoted by $S_{L1}$, and a warp amount of the silicon nitride substrate in the short-side direction is denoted by $S_{L2}$. A warp amount of the silicon nitride substrate in the diagonal line direction is denoted by $S_{L3}$, which is not illustrated.

A method for measuring the warp amount S is as follows. First, a straight line is drawn from one of opposite edges of the silicon nitride substrate to another one. The warp amount S is determined as a distance at which the silicon nitride substrate is most away from the straight line.

In the silicon nitride circuit board according to the embodiment, the warp amount $S_{L1}$ in the long-side direction and the warp amount $S_{L2}$ in the short-side direction both fall within a range from 0.01 to 1.0 mm. The silicon nitride circuit board according to the embodiment has given warp amounts in both of the long-side direction and the short-side direction. By adopting such a structure, the silicon nitride circuit board exerts an excellent TCT property even when a different in thickness between the front and rear metal plates is as large as 0.30 mm or larger. In addition, even when at least one of a leadframe, a heat sink, and a cooling fin having thicknesses of 0.4 mm or larger is attached, the silicon nitride circuit board does not bend, which will be described later. The term "to bend" used herein refers to the warp amount S increasing beyond 1.0 mm. The warp amounts of the silicon nitride substrate in the long-side direction and the short-side direction both preferably fall within a range from 0.1 to 1.0 mm.

The warp amount $S_{L3}$ of the silicon nitride substrate in the diagonal line direction preferably falls within a range of $0.1 \leq S_{L3} \leq 1.5$ mm. The warp amount $S_{L3}$ in the diagonal line direction more preferably falls within a range of $0.2 \leq S_{L3} \leq 0.7$ mm.

The leadframe is attached mainly for the purpose of continuity of the semiconductor element. Therefore, the leadframe is often extended to an outside of the silicon nitride circuit board. The heat sink and the cooling fin are attached on the rear side of the silicon nitride circuit board. The heat sink and the cooling fin are attached regularly on the rear side. Meanwhile, the leadframe is attached to a spot where a continuity is intended. Therefore, the leadframe is not always disposed regularly. Setting the warp amount $S_{L3}$ in the diagonal line direction at 0.1 to 1.5 mm makes it possible to set the warp amount of the silicon nitride substrate in an electronic component module at less than 0.1 mm (0 mm included) even when the leadframe is disposed irregularly. In other words, a silicon nitride circuit board having a warp amount $S_{L3}$ set within a range of $0.1 \leq S_{L3} \leq 1.5$ mm is suitable for those to which leadframe are attached. The term "to dispose regularly" refers to dispositions of left-right symmetry.

The longitudinal width L1 of the silicon nitride substrate is preferably 10 to 200 mm. The transverse width L2 of the silicon nitride substrate is preferably 10 to 200 mm. If the longitudinal width (L1) or the transverse width (L2) is short, being shorter than 10 mm, a footprint (mounting area) of a semiconductor element on the metal plate on the front side becomes small, and flexibility of design is decreased. In addition, it becomes difficult to form an area in which a bulging-out region of an attachment layer to be described later is provided. On the other hand, if the longitudinal width (L1) or the transverse width (L2) is long, being longer than 200 mm, it becomes difficult to control the warp amount (S) so that the warp amount (S) falls within a given range.

A ratio ($S_{L1}/S_{L2}$) between the warp amount ($S_{L1}$) in the long-side direction and the warp amount ($S_{L2}$) in the short-side direction preferably falls within a range from 1.2 to 20.0. In addition, the ratio ($S_{L1}/S_{L2}$) more preferably falls within a range from 1.2 to 6.0. The ratio ($S_{L1}/S_{L2}$) falling within the range from 1.2 to 20.0 indicates that the warp amounts in the long-side direction and the short-side direction are close to each other. By adopting such a structure, a TCT (thermal cycle test) property can be improved even when the difference in thickness between the metal plates on the front and rear sides becomes 0.30 mm or larger, further 0.50 mm or larger.

The metal plate is preferably attached (bonded) to the silicon nitride substrate through an attachment layer (bonding layer) containing an active metal. The active metal refers to one, or two or more of elements selected from Ti (titanium), Zr (zirconium), Hf (hafnium), Nb (niobium), and Al (aluminum). Among these elements, Ti is preferably used, as mentioned before. The attachment layer containing the active metal is preferably one in which use is made of an active metal brazing material that contains 40 to 80% by mass of Ag, 20 to 60% by mass of Cu, 0.1 to 5% by mass of Ti, 20% by mass or less (0 included) of Sn, and 20% by mass or less (0 included) of In. The attachment is made by interposing an active metal brazing material layer between the silicon nitride substrate and the metal plate and performing heat treatment. After the attachment, the active metal in the attachment layer is preferably mainly made of an active metal nitride.

Figure 4:
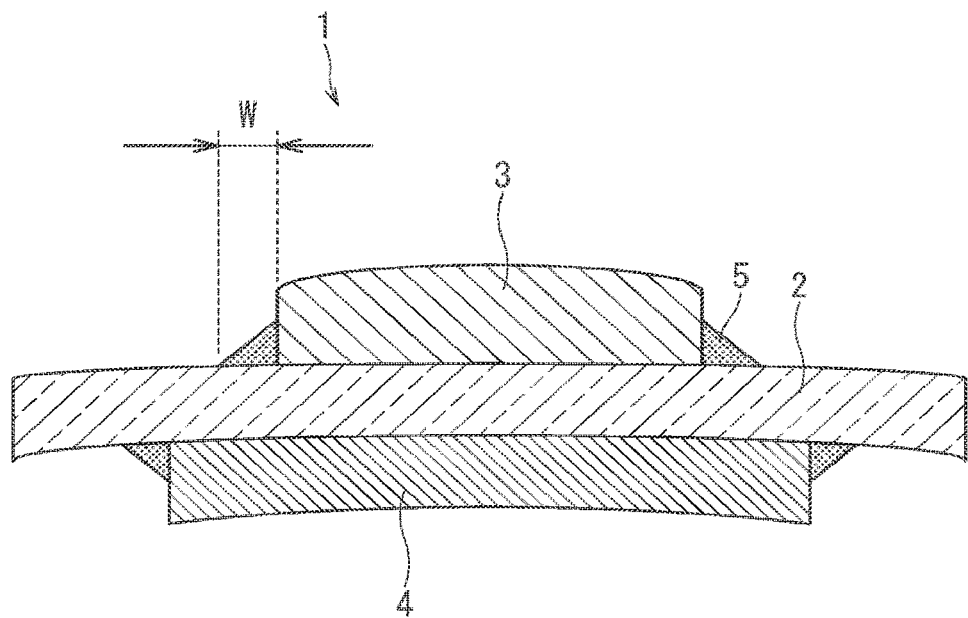
FIG. 4 is a lateral cross sectional view illustrating another example of the silicon nitride circuit board according to the embodiment.

The attachment layer preferably bulges out from edge portion of the metal plate. A bulging-out amount of the attachment layer bulging out from the edge portion of the metal plate is preferably 30 to 300 μm. FIG. 4 illustrates an example of a cross-sectional view of the silicon nitride circuit board in which the attachment layer includes a bulging-out portion. In the drawing, reference numeral 1 denotes the silicon nitride circuit board, and reference numeral 5 denotes the bulging-out portion of the attachment layer. Reference character W denotes the bulging-out amount of the attachment layer. The bulging-out portion 5 may climb up on a side surface of the metal plate. The provision of the bulging-out portion enables mitigation of thermal stress on the metal plate and the silicon nitride substrate. The bulging-out amount W preferably falls within a range from 50 to 300 μm, further a range from 50 to 200 μm.

Figure 8:
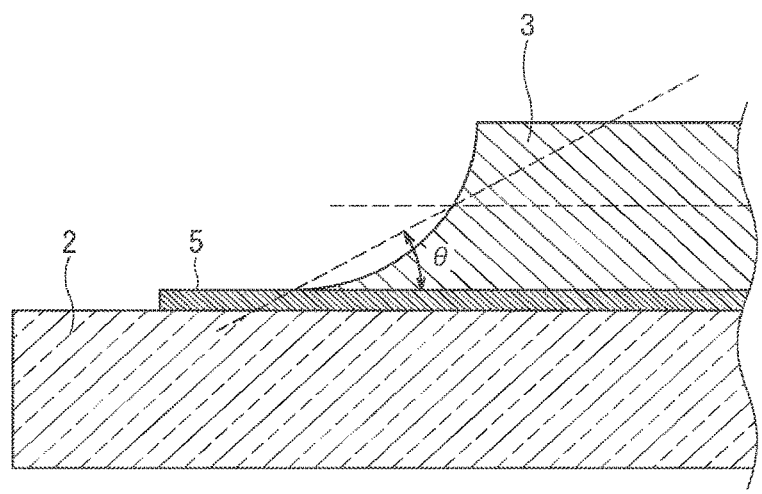
FIG. 8 is a cross-sectional view illustrating an example of a side surface of a metal plate of the silicon nitride circuit board according to the embodiment.

On the side surface of the metal plate, when a straight line is drawn from a point of ½ thickness of the metal plate to an edge portion of the metal plate on a silicon nitride substrate side, an angle between the straight line and a horizontal line (surface of the substrate) is preferably 60° or smaller. FIG. 8 illustrates an example of a lateral cross section of the metal plate of the silicon nitride circuit board according to the embodiment. In the drawing, reference numeral 2 denotes the silicon nitride substrate, reference numeral 3 denotes the metal plate, and reference numeral 5 denotes the bulging-out portion of the attachment layer.

A straight line is drawn from a point of ½ thickness of the metal plate 3 to the edge portion of the metal plate. An angle θ between the straight line and the horizontal line being 60° or smaller indicates a shape of the side surface of the metal plate extending in a direction toward the silicon nitride substrate side. This shape enables mitigation of thermal stress on the metal plate and the silicon nitride substrate. Therefore, the angle θ between the straight line and the horizontal line is preferably set to 60° or smaller, further 45° or smaller.

Combination of the bulging-out portion of the attachment layer and the angle θ allows a further mitigation of the thermal stress.

Thus, the TCT (thermal cycle test) property can be improved even when the thickness of the metal plate is increased, or the difference in thickness between the metal plates on the front and rear sides (|t1−t2|) is increased. A bulging-out amount W less than 30 μm results in an insufficient effect of providing the bulging-out portion. A large bulging-out amount W exceeding 300 μm not only results in a failure to obtain an additional effect but also becomes a cause of an increase in cost. Therefore, the bulging-out amount W is preferably 30 to 300 μm, further 50 to 200 μm. The angle θ is preferably set to 60° or smaller, further 45° or smaller. This configuration enables the mitigation of the thermal stress, thereby to improve the TCT property.

Figure 5:
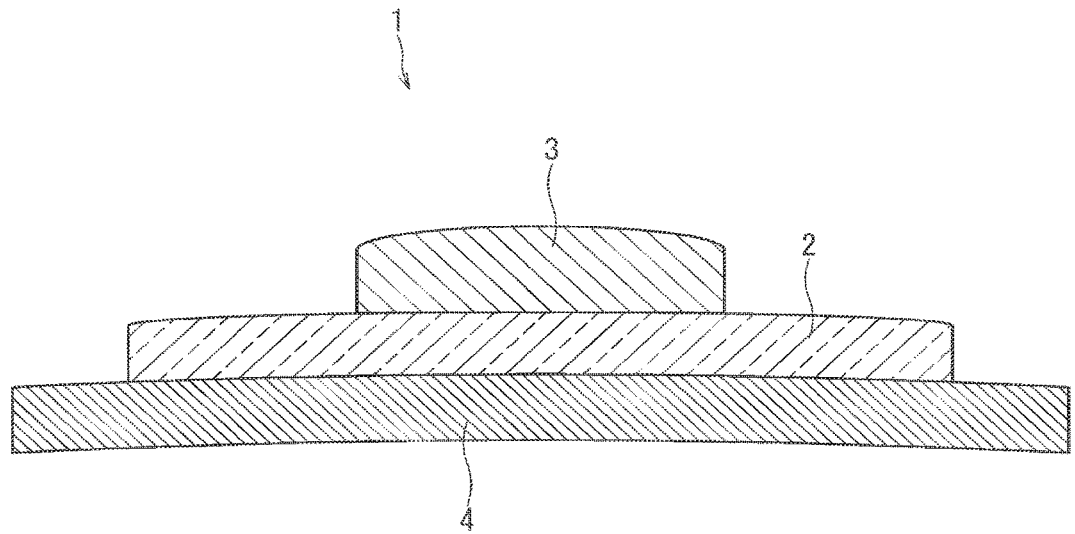
FIG. 5 is a lateral cross sectional view illustrating yet another example of the silicon nitride circuit board according to the embodiment.
Figure 6:
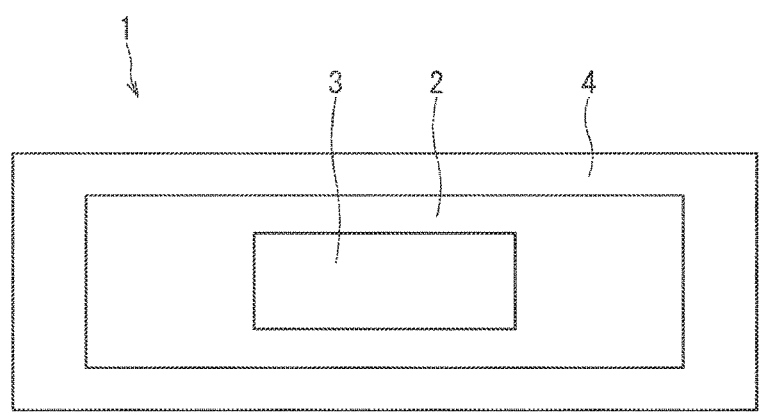
FIG. 6 is a top view illustrating yet another example of the silicon nitride circuit board according to the embodiment.

The metal plate on the rear side is preferably larger in dimension than the longitudinal width (L1) and the transverse width (L2) of the silicon nitride substrate. FIG. 5 and FIG. 6 illustrate an example of the silicon nitride circuit board that has a structure in which the metal plate on the rear side is larger than the silicon nitride substrate. FIG. 5 is a lateral cross sectional view, and FIG. 6 is a top view. In the drawings, reference numeral 1 denotes the silicon nitride circuit board, reference numeral 2 denotes the silicon nitride substrate, reference numeral 3 denotes the metal plate on the front side, and reference numeral 4 denotes the metal plate on the rear side.

Such a structure facilitates increasing the thickness t2 of the metal plate on the rear side. It is possible to establish a relation: t2−t1≥0.3 mm, further t2−t1≥0.8 mm. In addition, the thickness t2 of the metal plate on the rear side can be increased to be 1.0 mm or larger.

Adopting the structure in which the metal plate on the rear side is larger than the silicon nitride substrate allows an efficient emission (radiation) of heat of an electronic component mounted on the metal plate on the front side. In general, the heat generated from the electronic component performs 45° diffusion (or 45° heat dissipation). Adopting the structure in which the metal plate on the rear side is larger than the silicon nitride substrate allows the 45° diffusion to proceed smoothly.

It is preferable that the metal plate on the front side is a circuit plate, the metal plate on the rear side is a heat dissipation plate, and (a volume of the metal plate on the rear side/a volume of the metal plate on the front side)≥2 is established. This means that a volume of the heat dissipation plate (the metal plate on the rear side) is twice or more as large as a volume of the circuit plate (the metal plate on the front side). Examples of a method for increasing the volume include one to increase the thickness of the metal plate on the rear side, and one to increase longitudinal and transverse sizes of the metal plate on the rear side. In addition, a control of volume ratio between the metal plates on the front and rear sides is also effective in control of the warp amounts.

As described above, a thermal resistance (Rth) is determined as Rth=H/(k×A). Here, H represents heat transfer path, k represents thermal conductivity, and A represents heat dissipation area. Decreasing the thermal resistance (Rth) involves shortening the heat transfer path (H), increasing the thermal conductivity (k), and increasing the heat dissipation area (A). In the silicon nitride circuit board according to the embodiment, by performing thickness reduction of the silicon nitride substrate, it is possible to shorten a heat transfer path of a portion a thermal conductivity of which is low. By increasing the thickness of the metal plate or increasing a size of the metal plate, it is possible to increase the thermal conductivity (k) and the heat dissipation area (A) of the silicon nitride circuit board. Consequently, the thermal resistance (Rth) can be decreased.

The difference in thickness between the metal plates on the front side and the rear side is provided so that |t1−t2|≥0.30 mm is satisfied. By increasing the thickness of the metal plate on the front side, it is possible to given an additional current-carrying capacity. By increasing the thickness of the metal plate on the rear side, it is possible to provide a broad emission path of heat, allowing an improved heat dissipation property. The silicon nitride substrate has warp amounts of 0.01 to 1.0 mm in the long-side direction and the short-side direction. Provision of the given warp amounts allows an improved TCT property even when the difference in thickness is large, being 0.30 mm or larger.

Figure 7:
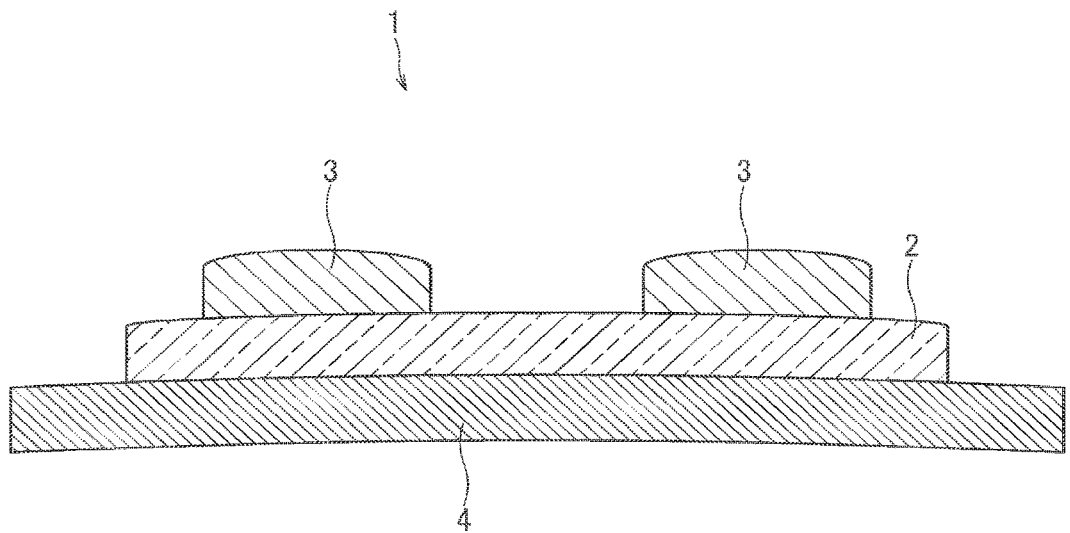
FIG. 7 is a lateral cross sectional view illustrating yet another example of the silicon nitride circuit board according to the embodiment.

There may be a plurality of metal plates on the front side, the metal plates being in a structure in which they are connected to one another. FIG. 7 illustrates an example of the silicon nitride circuit board in which a plurality of metal plates are attached on the front side. In the drawing, reference numeral 1 denotes the silicon nitride circuit board, reference numeral 2 denotes the silicon nitride substrate, reference numeral 3 denotes the metal plates on the front side, and reference numeral 4 denotes the metal plate on the rear side. FIG. 7 is a configuration example in which two metal plates are arranged on the front side of the substrate. Also in the structure in which two metal plates are attached on the front side in such a manner, both of the metal plates are to satisfy the relation of |t1−t2|≥0.30 mm. Even in a case where three or more metal plates are attached on the front side, the metal plates are to satisfy |t1−t2|≥0.30 mm.

A silicon nitride circuit board such as the one above is suitable for an electronic component module on which an electronic component is mounted. Examples of the electronic component include semiconductor elements and thermistors. Since the silicon nitride circuit board according to the embodiment has a decreased thermal resistance, the silicon nitride circuit board is suitable for a semiconductor element having a high junction temperature. An SiC device has a high junction temperature being 150° C. or higher. In other words, the circuit board according to the present invention is suitable for an electronic component module on which a SiC device is mounted.

Figure 9:
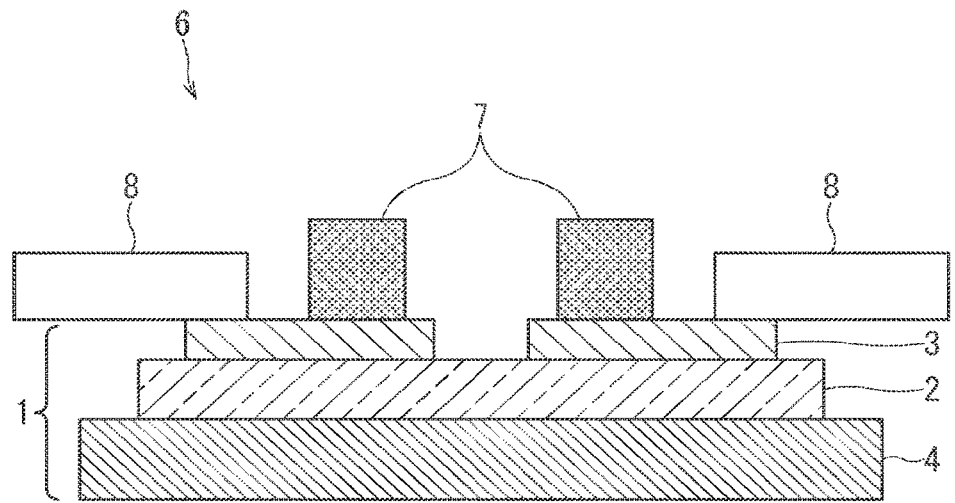
FIG. 9 is a lateral cross sectional view illustrating an example of an electronic component module according to the embodiment.
Figure 10:
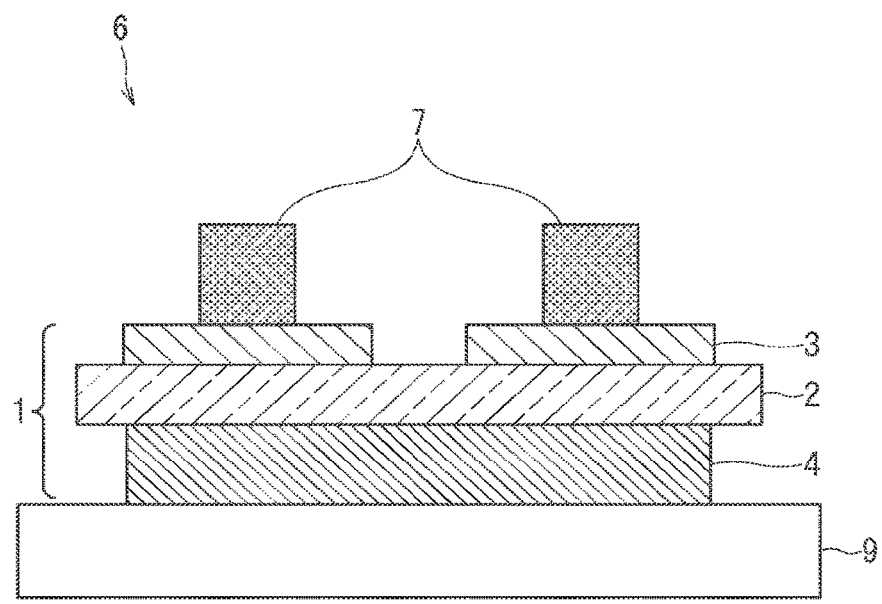
FIG. 10 is a lateral cross sectional view illustrating another example of the electronic component module according to the embodiment.
Figure 11:
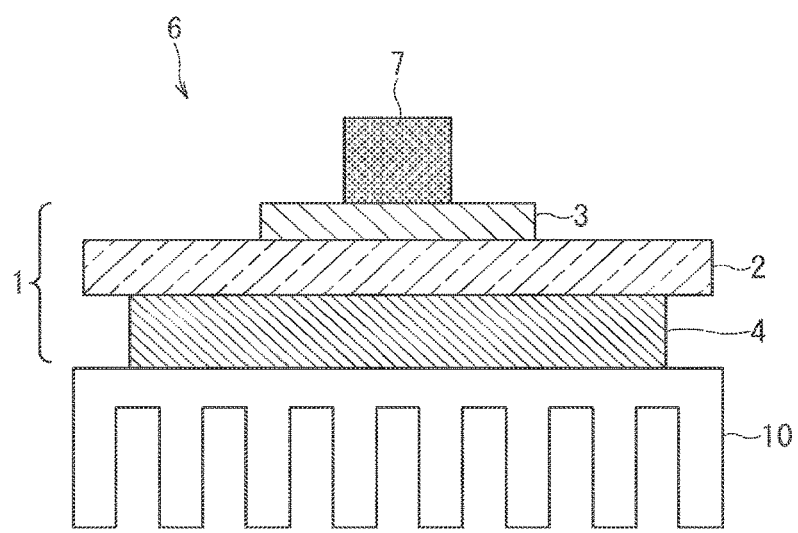
FIG. 11 is a lateral cross sectional view illustrating yet another example of the electronic component module according to the embodiment.

To the metal plate on the front side or the metal plate on the rear side, at least one of a leadframe, a heat sink, and a cooling fin having a thickness of 0.4 mm or larger is preferably attached. FIG. 9 illustrates an example of the electronic component module on which a leadframe is attached. FIG. 10 illustrates an example of the electronic component module on which a heat sink is attached. FIG. 11 illustrates an example of the electronic component module on which a cooling fin is attached. In the drawings, reference numeral 1 denotes the silicon nitride circuit board, reference numeral 6 denotes the electronic component module, reference numeral 7 denotes electronic components, reference numeral 8 denotes the leadframe, reference numeral 9 denotes the heat sink, and reference numeral 10 denotes the cooling fin.

FIG. 9 illustrates the electronic component module in which the electronic components 7 and the leadframe 8 are connected to the metal plate 3 on the front side. The leadframe 8 preferably has a thickness of 0.4 mm or larger. Examples of the leadframe include a metal plate such as a copper plate. In addition, by increasing the thickness of the leadframe to 0.4 mm or larger, it is possible to give an additional current-carrying capacity and give an improved heat dissipation property. The thickness of the leadframe has any upper limit, which is however preferably 5 mm or smaller.

Adopting such a structure enables a structure that dispenses with wire bonding. By not adopting a wire bonding structure, it is possible to effectively prevent a wire from being broken in performing resin sealing by a transfer molding method.

In the transfer molding method, an electronic component module is disposed in a heated mold. The electronic component module is disposed in a space called a cavity. The mold is made up of upper and lower molds as a set, defining the cavity. Next, a resin tablet (resin in a hardened form) is charged into a space called a pot. The resin tablet charged into the pot starts to melt gradually and is charged into the cavity. With the resin in a liquid state, a space around an electronic component is filled. When the filling resin is hardened, the electronic component is brought into a molded state. The transfer molding method allows a molding process to be performed on a lot of electronic component modules by increasing a size of a mold and thus is a resin sealing method excellent in volume productivity (mass productivity).

Meanwhile, the transfer molding method is a manufacturing method in which a wire is likely to deform or to be broken. Therefore, by adopting the structure dispensing with wire bonding, it is possible to eliminate a break failure or a deformation failure of a wire in performing resin sealing by a transfer molding method.

Although description is made about the advantage of dispensing with wire bonding, continuity of the electronic component may be provided by the wire bonding.

FIG. 10 illustrates the electronic component module in which a heat sink 9 is attached to the metal plate on the rear side. The heat sink 9 preferably has a thickness of 0.4 mm or larger. The heat sink is made up of a metal plate such as a copper plate. In addition, by increasing the thickness of the heat sink to 0.4 mm or larger, it is possible to give an improved heat dissipation property. The upper limit of the thickness of the heat sink is not particularly limited, but the thickness is preferably 10 mm or smaller.

FIG. 11 illustrates the electronic component module in which a cooling fin 10 is attached to the metal plate 4 on the rear side. While the heat sink 9 is in a plate shape, the cooling fin is in a comb shape. The comb shape may be in various protrusion shapes such as a groove shape and a pin shape. By adopting the comb shape, a heat dissipation area of the cooling fin can be increased. The thickness of the cooling fin does not have any particular upper limit, but is however preferably 20 mm or smaller.

Of the leadframe, the heat sink, and the cooling fin, one may be attached, or two may be attached. In the case of attaching two of them, there are a combination of the leadframe and the heat sink, and a combination of the leadframe and the cooling fin.

When the electronic component module according to the embodiment has a structure in which at least one of the leadframe, the heat sink, and the cooling fin having thicknesses of 0.4 mm or larger is attached to the metal plate on the front side or the metal plate on the rear side, the warp amounts of the silicon nitride substrate in the long-side direction and the short-side direction both can be set at less than 0.1 mm (0 mm included).

In conventional practice, when a thick leadframe, heat sink, or cooling fin having a thickness of 0.4 mm or larger is attached, the attachment increases warp amounts of a silicon nitride circuit board. In contrast, since the silicon nitride circuit board according to the embodiment has given warp amounts, it is possible to mitigate a stress occurring when a thick leadframe or the like is attached. Therefore, the warp amounts of the silicon nitride substrate in the long-side direction and the short-side direction both can be decreased to less than 0.1 mm (0 mm included) when the electronic component module is formed.

In addition, decreasing the warp amounts of the silicon nitride substrate of the electronic component module facilitates resin sealing. In the case of performing the resin sealing by the transfer molding method mentioned before, when the warp amounts of the silicon nitride substrate are small, the melted resin enters gaps stably. As a result, the resin sealing can be performed leaving no gaps. Also from this regard, the electronic component module according to the embodiment is suitable for a structure on which resin sealing is performed.

If the electronic component module is one to which a heat dissipating member such as a leadframe, a heat sink, and a cooling fin is attached, the electronic component module exerts an excellent TCT property. Even when a TCT (thermal cycle test) is actually conducted 600 cycles with 1 cycle of the TCT including −45° C.×30 min→room temperature (25° C.)×10 min→150° C.×30 min→room temperature (25° C.)×10 min, no peeling occurs on the metal plate, and no crack occurs on the silicon nitride substrate. Therefore, the electronic component module exerts an excellent durability even when a SiC device, which has a high junction temperature, is used as an electronic component.

Next, a method for producing of the silicon nitride circuit board will be described. The producing method for the silicon nitride circuit board according to the embodiment does not have any limit, and is any method as long as the silicon nitride circuit board has the structure mentioned before. However, examples of a method to efficiently obtain the silicon nitride circuit board include the following method.

First, a silicon nitride substrate is prepared. The silicon nitride substrate is to be one having a three-point flexural strength of 500 MPa or higher. The silicon nitride substrate preferably has a fracture toughness value of 6.0 MPa·m$^{1/2}$ or higher. In addition, the silicon nitride substrate preferably has a thermal conductivity of 50 W/m·K or higher. The thermal conductivity is preferably 50 W/m·K or higher, further 80 W/m·K or higher. The silicon nitride substrate preferably has a thickness of 0.1 mm or larger and 0.70 mm or smaller. Further, a thickness reduction down to 0.33 mm or smaller and 0.26 mm or smaller is preferably performed.

As to the warp amounts of the prepared silicon nitride substrate, the warp amount $S_{L1}$ in the long-side direction and the warp amount $S_{L2}$ in the short-side direction are both supposed to be less than 0.1 mm.

Next, metal plates are prepared. The metal plates are preferably one selected from copper plates, copper alloy plates, Al plates, and Al alloy plates. The thicknesses of the metal plates are set so as to satisfy the relation |t1−t2|≥0.30 mm, where t1 represents the thickness of the metal plate on the front side, and t2 represents the thickness of the metal plate on the rear side.

Next, a step of attaching (bonding) the silicon nitride substrate and the metal plates is performed. In the attachment step, an active metal brazing material is used. When the metal plates are copper plates or copper alloy plates, the active metal is supposed to contain one selected from Ti (titanium), Zr (zirconium), Hf (hafnium), and Nb (niobium). As the active metal, Ti is the most preferable. Components other than the active metal may include Ag, Cu, In, and Sn. As the active metal brazing material, one that contains 40 to 80% by mass of Ag, 20 to 60% by mass of Cu, 0.1 to 10% by mass of Ti, 20% by mass or less (0 included) of Sn, and 20% by mass or less (0 included) of In.

In a case where the metal plates are Al plates or Al alloy plates, Al (aluminum) is used as an active metal. Examples of a component other than the active metal include Si (silicon). As an active metal brazing material in this case, use is made of a brazing material that contains 0.01 to 10% by mass of Si, and Al as the remainder.

The side surface of the metal plate may be worked in advance so that, when a straight line is drawn from a point of ½ thickness of the metal plate to an edge portion of the metal plate on a silicon nitride substrate side, an angle between the straight line and a horizontal line is 60° or smaller. In addition, the metal plate may be treated by etching treatment after the attachment so that, when a straight line is drawn from a point of ½ thickness of the metal plate to an edge portion of the metal plate on a silicon nitride substrate side, an angle between the straight line and the horizontal line is 60° or smaller.

A resin binder is added to the active metal brazing material, whereby an active metal brazing material paste is prepared. The active metal brazing material paste is applied to the silicon nitride substrate, whereby an active metal brazing material paste layer is formed. On the active metal brazing material paste layer, the metal plate is disposed. In the case of providing a bulging-out portion of an attachment layer, the active metal brazing material paste layer is provided as one that is slightly larger than a size of the metal plate in the longitudinal and transverse directions. An application thickness of the active metal brazing material paste layer preferably falls within a range from 10 to 40 μm. A thickness of the active metal brazing material paste layer less than 10 μm leads to a risk that a sufficient attachment strength (bonding strength) is not obtained. A large thickness of the active metal brazing material paste layer exceeding 40 μm not only results in a failure to obtain a further improved attachment strength but also becomes a cause of an increase in cost. Therefore, the thickness of the active metal brazing material paste layer preferably falls within a range from 10 to 40 μm, further 15 to 25 μm.

Next, a heating step is performed. A heating temperature preferably falls within a range from 600 to 900° C. In a case where the active metal brazing material contains one selected from Ti, Zr, Hf, and Nb, an attachment temperature preferably falls within a range from 750 to 900° C. In a case where the active metal brazing material contains Al, the attachment temperature preferably falls within a range from 600 to 750° C. The heating step is preferably performed in a vacuum atmosphere. A degree of vacuum is preferably $1\times10^{-2}$ Pa or lower, further $4\times10^{-3}$ Pa or lower. By performing the heating step in the vacuum atmosphere, it is possible to effectively prevent the copper plate or the active metal brazing material from being oxidized or nitrided. A cooling rate after the heating step is preferably set at 80° C./h or lower. By setting the cooling rate at a low rate, it is possible to mitigate thermal stress in the heating step.

By performing such steps, it is possible to manufacture a silicon nitride circuit board having a warp amount $S_{L1}$ in the long-side direction and a warp amount $S_{L2}$ in the short-side direction that fall within a range from 0.01 to 1.0 mm.

As necessary, a step of attaching one or two of a leadframe, a heat sink, and a cooling fin is performed. The leadframe, the heat sink, and the cooling fin are preferably those having thicknesses of 0.4 mm or larger. The attachment of a heat dissipating member such as the leadframe, the heat sink, and the cooling fin is performed using solder.

On the metal plate on the front side, an electronic component is mounted. Examples of the electronic component may include semiconductor elements and thermistors. The mounting of the electronic component is preferably performed using solder. The attachment of the heat dissipating member such as the leadframe and the attachment of the electronic component may be performed at a same time in a same step or may be performed in different steps.

As necessary, a resin sealing step is performed. The resin sealing step is preferably performed by a transfer molding method. The transfer molding method is a method excellent in mass productivity. The silicon nitride circuit board according to the embodiment allows the warp amounts to be decreased even when the resin sealing is performed by the transfer molding method.

EXAMPLES

Examples 1 to 7 and Comparative Examples 1 to 3

As a silicon nitride substrate, a substrate having a thickness of 0.32 mm, a long-side direction length (L1) of 50 mm, a short-side direction length (L2) of 35 mm was prepared. The silicon nitride substrate had a three-point flexural strength of 600 MPa, a thermal conductivity of 90 W/m·K, and a fracture toughness value of 6.5 MPa·m$^{1/2}$. Warp amounts of the silicon nitride substrate before attachment of copper plates were a warp amount $S_{L1}$ in a long-side direction=0.02 mm, a warp amount $S_{L2}$ in a short-side direction=0.01 mm, and a warp amount $S_{L3}$ in a diagonal line direction=0.01 mm.

Next, as metal plates (circuit plate), copper plates were prepared. As an active metal brazing material, a brazing material containing Ag (60 wt %), Cu (30 wt %), In (8 wt %), and Ti (2 wt %) was prepared. The brazing material and a resin binder were mixed together, whereby an active metal brazing material paste was prepared. To both surfaces of the silicon nitride substrate, the active metal brazing material paste was applied, the copper plates were disposed, and the heating step was performed in a vacuum atmosphere, at 1×10$^{-3}$ Pa or lower, at 780 to 830° C. A cooling rate after the heating step was set at 50 to 70° C./h for Examples and at 300 to 400° C./h for Comparative Examples.

Sizes of the copper plates on the front side, sizes of the copper plates on the rear side, side surface angles of the metal plates, and bulging-out amounts of the active metal brazing material are shown in Table 1. The side surface angles of the metal plate were each determined as an angle θ of a straight line drawn from a point of ½ thickness of the metal plate to an edge portion of the metal plate on the silicon nitride substrate side, as illustrated in FIG. 8.

TABLE 1

| Sample No. | Sizes of Copper Plate on Front Side (Length × Width × Thickness mm) | Sizes of Copper Plate on Rear Side (Length × Width × Thickness mm) | Side Surface Angle of Metal Plate θ (°) | Bulging-out Amount of Active Metal Brazing Material (μm) |
|---|---|---|---|---|
| Example 1 | 40 × 25 × 0.3 | 40 × 30 × 0.6 | 60 | 50 |
| Example 2 | 40 × 25 × 0.3 | 40 × 30 × 1.0 | 40 | 70 |
| Example 3 | 40 × 25 × 0.3 | 40 × 30 × 2.0 | 50 | 80 |
| Example 4 | 30 × 30 × 0.8 | 40 × 30 × 3.0 | 60 | 100 |
| Example 5 | 35 × 30 × 0.4 | 60 × 45 × 5.0 | 45 | 120 |
| Example 6 | 20 × 20 × 0.3, 20 × 20 × 0.4 | 60 × 45 × 7.0 | 40 | 150 |
| Example 7 | 40 × 25 × 0.4 | 40 × 30 × 1.5 | 50 | 200 |
| Comparative Example 1 | 40 × 25 × 0.3 | 40 × 25 × 0.3 | 45 | 0 |
| Comparative Example 2 | 40 × 25 × 0.25 | 40 × 25 × 0.50 | 45 | 50 |
| Comparative Example 3 | 40 × 25 × 0.25 | 40 × 25 × 0.50 | 90 | 200 |

For the silicon nitride circuit boards obtained by the producing method described above, the warp amount $S_{L1}$ in the long-side direction, the warp amount $S_{L2}$ in the short-side direction, the warp amount $S_{L3}$ in the diagonal line direction, and a direction of a warp were measured. The measurement of the warp amount was performed by drawing a straight line from one of opposite edges of the silicon nitride substrate to another one, as shown in FIG. 2, and determining the warp amount as a distance at which the silicon nitride substrate is most away from the straight line. Results of the measurement are shown in Table 2 below.

TABLE 2

| Sample No. | Warp Amount in Long Side Direction $S_{L1}$ (mm) | Warp Amount in Short Side Direction $S_{L2}$ (mm) | Ratio ($S_{L1}/S_{L2}$) | Warp Amount in Diagonal Line Direction $S_{L3}$ (mm) | Warp Direction |
|---|---|---|---|---|---|
| Example 1 | 0.33 | 0.15 | 2.2 | 0.27 | Convex toward Rear Side |
| Example 2 | 0.8 | 0.5 | 1.6 | 0.7 | Convex toward Front Side |
| Example 3 | 0.7 | 0.6 | 1.2 | 0.55 | Convex toward Front Side |
| Example 4 | 1.0 | 0.5 | 2.0 | 0.9 | Convex toward Rear Side |
| Example 5 | 0.8 | 0.6 | 1.3 | 0.7 | Convex toward Rear Side |
| Example 6 | 0.6 | 0.1 | 6.0 | 0.5 | Convex toward Rear Side |
| Example 7 | 0.55 | 0.4 | 1.4 | 0.45 | Convex toward Rear Side |
| Comparative Example 1 | 0.00 | 0.00 | — | — | — |
| Comparative Example 2 | 0.25 | 0.25 | 1.0 | 0.20 | Convex toward Rear Side |
| Comparative Example 3 | 0.4 | 0.3 | 1.3 | 0.3 | Convex toward Rear Side |

The silicon nitride circuit boards in Examples had warp amounts intended as an objective.

Examples 8 to 17

As silicon nitride substrates, substrates shown in Table 3 were prepared. As to warp amounts of the substrates, warp amounts in the long-side direction were 0.02 mm or smaller, and warp amounts in the short-side direction were 0.02 mm or smaller. The step of attaching metal plates was the same as that in Example 1.

TABLE 3

| Sample No. | Sizes of Substarte (Length × Width × Thickness mm) | Three-Point Flexural Strength (MPa) | Thermal Conductivity (W/m · K) | Fracture Toughness value (MPa · m$^{1/2}$) |
|---|---|---|---|---|
| Example 8 | 200 × 100 × 0.32 | 700 | 50 | 7.2 |
| Example 9 | 100 × 80 × 0.32 | 650 | 60 | 6.0 |
| Example 10 | 30 × 20 × 0.25 | 650 | 90 | 6.3 |
| Example 11 | 60 × 40 × 0.25 | 550 | 60 | 6.5 |
| Example 12 | 55 × 50 × 0.25 | 600 | 90 | 6.8 |
| Example 13 | 70 × 50 × 0.25 | 620 | 90 | 6.8 |
| Example 14 | 60 × 40 × 0.20 | 670 | 95 | 6.7 |
| Example 15 | 55 × 40 × 0.50 | 600 | 90 | 6.8 |
| Example 16 | 55 × 30 × 0.635 | 600 | 90 | 6.8 |
| Example 17 | 50 × 40 × 0.635 | 650 | 90 | 6.6 |

Next, copper plates shown in Table 4 were attached.

TABLE 4

| Sample No. | Sizes of Copper Plate on Front Side (Length × Width × Thickness mm) | Sizes of Copper Plate on Rear Side (Length × Width × Thickness mm) | Side Surface Angle of Metal Plate θ (°) | Bulging-out Amount of Active Metal Brazing Material (μm) |
|---|---|---|---|---|
| Example 8 | Three Pieces of 30 × 30 × 0.3 | 180 × 80 × 1.0 | 45 | 80 |
| Example 9 | 40 × 25 × 0.3, 20 × 20 × 0.5 | 104 × 84 × 2.0 | 35 | 100 |
| Example 10 | 20 × 15 × 0.3 | 40 × 30 × 2.0 | 60 | 120 |
| Example 11 | 40 × 30 × 0.3 | 50 × 30 × 2.0 | 50 | 100 |
| Example 12 | 35 × 30 × 0.4 | 60 × 45 × 5.0 | 50 | 120 |
| Example 13 | 20 × 20 × 0.3, 20 × 20 × 0.4 | 60 × 45 × 7.0 | 45 | 70 |
| Example 14 | 40 × 20 × 0.3 | 40 × 30 × 0.9 | 40 | 20 |
| Example 15 | Two Pieces of 20 × 20 × 0.2 | 45 × 30 × 1.0 | 45 | 30 |
| Example 16 | 40 × 20 × 0.4 | 45 × 20 × 1.5 | 45 | 25 |
| Example 17 | Two Pieces of 30 × 15 × 0.3 | 45 × 35 × 1.6 | 45 | 40 |

For the obtained silicon nitride circuit boards, the warp amount $S_{L1}$ in the long-side direction, the warp amount $S_{L2}$ in the short-side direction, the warp amount $S_{L3}$ in the diagonal line direction, and a direction of a warp were measured. The measurement of the warp amount was performed by drawing a straight line from one of opposite edges of the silicon nitride substrate to another one, as shown in FIG. 2, and determining the warp amount as a distance at which the substrate is most away from the straight line. Results of the measurement are shown in Table 5 below.

TABLE 5

| Sample No. | Warp Amount in Long Side Direction $S_{L1}$ (mm) | Warp Amount in Short Side Direction $S_{L2}$ (mm) | Ratio ($S_{L1}/S_{L2}$) | Warp Amount in Diagonal Line Direction $S_{L3}$ (mm) | Warp Direction |
|---|---|---|---|---|---|
| Example 8 | 0.9 | 0.65 | 1.4 | 1.0 | Convex toward Rear Side |
| Example 9 | 0.7 | 0.2 | 3.5 | 0.7 | Convex toward Rear Side |
| Example 10 | 0.3 | 0.1 | 3.0 | 0.2 | Convex toward Rear Side |
| Example 11 | 0.4 | 0.15 | 2.7 | 0.35 | Convex toward Front Side |
| Example 12 | 0.5 | 0.2 | 2.5 | 0.5 | Convex toward Rear Side |
| Example 13 | 0.85 | 0.65 | 1.3 | 0.9 | Convex toward Rear Side |
| Example 14 | 1.0 | 0.2 | 5.0 | 0.7 | Convex toward Rear Side |
| Example 15 | 0.9 | 0.1 | 9.0 | 0.7 | Convex toward Rear Side |
| Example 16 | 0.15 | 0.01 | 15.0 | 0.1 | Convex toward Rear Side |
| Example 17 | 0.9 | 0.05 | 18.0 | 0.95 | Convex toward Rear Side |

Next, in Examples 1 to 17 and Comparative Examples 1 to 3, TCT properties of the silicon nitride circuit boards and attachment strengths of the metal plates were measured. The TCT (thermal cycle test) was conducted with 1 cycle thereof including −40° C.×30 min of retention→room temperature (25° C.)×10 min→125° C.×30 min→room temperature (25° C.)×10 min, and presence/absence of peeling in the metal plate and occurrence of a crack in the silicon nitride substrate after 600 cycles were measured. The attachment strengths of the metal plates were measured in terms of peel strength. Results of the measurement are shown in Table 6.

TABLE 6

| Sample No. | TCT (Presence/Absence of Peeling in Metal Plate and Occurrence of Crack in Silicon Nitride Substrate) | Attachment Strength of Metal Plate (kN/m) |
|---|---|---|
| Example 1 | None | 25 |
| Example 2 | None | 23 |
| Example 3 | None | 25 |
| Example 4 | None | 28 |
| Example 5 | None | 25 |
| Example 6 | None | 30 |
| Example 7 | None | 25 |
| Comparative Example 1 | None | 20 |
| Comparative Example 2 | None | 25 |
| Comparative Example 3 | None | 28 |
| Example 8 | None | 25 |
| Example 9 | None | 23 |
| Example 10 | None | 28 |
| Example 11 | None | 30 |
| Example 12 | None | 22 |
| Example 13 | None | 26 |
| Example 14 | None | 26 |
| Example 15 | None | 27 |
| Example 16 | None | 25 |
| Example 17 | None | 25 |

As is clear from the results shown in Table 6 above, the silicon nitride circuit boards in Examples and Comparative Examples were excellent in TCT property and attachment strength.

Next, a leadframe, a heat sink, a cooling fin were attached. The leadframe, the heat sink, and the cooling fin were all manufactured using copper plates. As an electronic component, a semiconductor element was mounted on a front-side copper plate. The attachment of a heat dissipating member such as the leadframe, the heat sink, and the cooling fin, and the mounting of the semiconductor element were performed by solder attachment. Through these steps, electronic component modules were manufactured.

For the obtained electronic component modules, warp amounts and TCT properties of the silicon nitride substrates were measured. The warp amounts of the silicon nitride substrates were measured by the same method as that in Example 1. As to the TCT properties, the TCT (thermal cycle test) was conducted with 1 cycle including −45° C.×30 min→room temperature (25° C.)×10 min→150° C.×30 min of retention→room temperature (25° C.)×10 min, presence/absence of peeling in the metal plate and occurrence of a crack after 600 cycles and 1000 cycles were performed were investigated. Results of the measurement and investigation are shown in Table 7 and Table 8 below.

TABLE 7

| Sample No. | Heat Dissipation Member (Length × Width × Thickness mm) | Warp Amounts of Silicon Niotride Substrate | | TCT (Presence/Absence of Peeling in Metal Plate and Occurrence of Crack in Silicon Nitride Substrate) | |
|---|---|---|---|---|---|
| | | Warp Amount in Long-Side Direction: $S_{L1}$ (mm) | Warp Amount of Short-Side Direction: $S_{L2}$ (mm) | 600 Cycles | 1000 Cycles |
| Example 1 | Leadframe (50 × 10 × 0.4) | 0.07 | 0.02 | None | None |
| Example 2 | Heat Sink (50 × 40 × 2.0) | 0.05 | 0.04 | None | None |
| Example 3 | Cooling Fin (50 × 40 × 3.0) | 0.08 | 0.06 | None | Observed |
| Example 4 | Leadframe (30 × 10 × 1.0) | 0.07 | 0.03 | None | None |
| Example 5 | Leadframe (30 × 10 × 0.8) | 0.09 | 0.05 | None | None |
| Example 6 | Each of Leadframes are attached (30 × 10 × 0.6) | 0.07 | 0.07 | None | None |
| Example 7 | Leadframe (20 × 10 × 0.5) | 0.06 | 0.04 | None | None |
| Comparative Example 1 | Leadframe (20 × 10 × 0.5) | 0.25 | 0.15 | Observed | — |
| Comparative Example 2 | Leadframe (20 × 10 × 0.5) | 0.08 | 0.06 | Observed | — |
| Comparative Example 3 | Leadframe (20 × 10 × 0.5) | 0.07 | 0.03 | Observed | — |

TABLE 8

| Sample No. | Heat Dissipation Member (Length × Width × Thickness mm) | Warp Amounts of Silicon Nitride Substrate | | TCT (Presence/Absence of Peeling in Metal Plate and Occurrence of Crack in Silicon Nitride Substrate) | |
|---|---|---|---|---|---|
| | | Warp Amount in Long-Side Direction $S_{L1}$ (mm) | Warp Amount in Short-Side Direction $S_{L2}$ (mm) | 600 Cycles | 1000 Cycles |
| Example 8 | Leadframes were connected (20 × 8 × 0.5) | 0.08 | 0.06 | None | None |
| Example 9 | Leadframes were connected (20 × 10 × 0.5) | 0.08 | 0.08 | None | None |
| Example 10 | Leadframes were connected (20 × 10 × 1.0) Cooling Fin was connected (44 × 34 × 2.0) | 0.05 | 0.05 | None | Observed |
| Example 11 | Heat Sink was connected (45 × 35 × 2.0) | 0.08 | 0.07 | None | None |
| Example 12 | Leadframe was connected (20 × 10 × 0.6) Heat Sink was connected (62 × 46 × 1.0) | 0.05 | 0.05 | None | None |
| Example 13 | Leadframes were connected (20 × 10 × 0.5) | 0.06 | 0.04 | None | None |
| Example 14 | Leadframe was connected (30 × 10 × 0.5) | 0.09 | 0.06 | None | None |
| Example 15 | Leadframes were connected (30 × 10 × 0.6) | 0.03 | 0.02 | None | None |
| Example 16 | Leadframe was connected (30 × 10 × 0.5) | 0.02 | 0.02 | None | None |
| Example 17 | Leadframes were connected (30 × 10 × 0.6) | 0.02 | 0.02 | None | None |

The electronic component module in each Example exerted excellent TCT properties even when the heat dissipating member (the leadframe, the heat sink, and the cooling fin) having a thickness of 0.4 mm or larger was attached. In particular, even when the TCT test with a high-temperature region set at a higher temperature of 150° C. was conducted, good results were also obtained.

In contrast, as to the silicon nitride circuit board in Comparative Example 1, although the warp amounts were small, the warp amounts were increased when the leadframe was attached. As a result, the TCT property was decreased as an electronic component module.

Since the electronic component module in each Example allows continuity using a leadframe, a structure dispensing with wire bonding can be adopted. Therefore, occurrence of a deformation failure or a break failure of a wire is avoided when the resin sealing is performed by the transfer molding method. In other words, the electronic component module according to the embodiment is suitable for a resin sealed structure by the transfer molding method.

Several embodiments of the present invention are illustrated above. However, these embodiments are presented by way of example only and not intended to limit the scope of the invention. These novel embodiments can be implemented in other various forms. Various omissions, substitutions, alterations, and the like of the embodiments can be made without departing from the gist of the invention. These embodiments and modifications thereof are included in the scope and the gist of the invention and included in the inventions described in claims and a scope of equivalents of the inventions. The embodiments described above can be implemented in combination with one another.

REFERENCE SIGNS LIST 1 silicon nitride circuit board
2 silicon nitride substrate
3 metal plate on front side
4 metal plate on rear side
5 bulging-out portion of attachment layer
6 electronic component module
7 electronic component
8 leadframe
9 heat sink
10 cooling fin

The invention claimed is:

1. A silicon nitride circuit board in which metal plates are attached on front and rear sides of a silicon nitride substrate having a three-point flexural strength of 500 MPa or higher, wherein
assuming that a thickness of the metal plate on the front side is denoted by t1, and a thickness of the metal plate on the rear side is denoted by t2, a numerical relation: $|t1-t2| \geq 0.30$ mm is satisfied, and a warp is formed in the silicon nitride substrate so that the silicon nitride substrate is convex toward the metal plate on one of the front side or the rear side; and
warp amounts of the silicon nitride substrate in a long-side direction and a short-side direction both fall within a range from 0.01 to 1.0 mm;
wherein assuming that a warp amount of the silicon nitride substrate in the long-side direction is denoted by $S_{L1}$, and a warp amount of the silicon nitride substrate in the short-side direction is denoted by $S_{L2}$, a ratio $(S_{L1}/S_{L2})$ falls within a range from 1.2 to 20.0; and
wherein assuming that a length of the silicon nitride substrate in a diagonal line direction is denoted by L3, and a warp amount in the diagonal line direction is denoted by $S_{L3}$, $S_{L3}$ falls within a range of $0.1 \leq S_{L3} \leq 1.5$ mm.

2. The silicon nitride circuit board according to claim 1, wherein a longitudinal width (L1) of the silicon nitride substrate falls within a range from 10 to 200 mm, and a transverse width (L2) of the silicon nitride substrate falls within a range from 10 to 200 mm.

3. The silicon nitride circuit board according to claim 1, wherein on a side surface of the metal plate, when a straight line is drawn from a point of ½ thickness of the metal plate to an edge portion of the metal plate on a silicon nitride substrate side, the straight line and a surface of the silicon nitride substrate forms an angle of 60° or smaller.

4. The silicon nitride circuit board according to claim 1, wherein each of the metal plates is attached to the silicon nitride substrate through an attachment layer containing an active metal interposed therebetween, and a bulging-out amount of the attachment layer bulging out from an edge portion of the metal plate is 30 to 300 μm.

5. The silicon nitride circuit board according to claim 1, wherein the metal plate on the rear side is larger than a longitudinal width (L1) and a transverse width (L2) of the silicon nitride substrate.

6. The silicon nitride circuit board according to claim 1, wherein the silicon nitride substrate has a thermal conductivity of 50 W/m·K or higher and a thickness of 0.70 mm or smaller.

7. The silicon nitride circuit board according to claim 1, wherein the metal plate on the front side is a circuit plate, the metal plate on the rear side is a heat dissipation plate, and (a volume of the metal plate on the rear side/a volume of the metal plate on the front side)≥2 is established.

8. The silicon nitride circuit board according to claim 1, wherein there are a plurality of metal plates attached on the front side.

9. An electronic component module comprising the silicon nitride circuit board according to claim 1, on which an electronic component is mounted.

10. The electronic component module according to claim 9, wherein at least one of a leadframe, a heat sink, and a cooling fin having thicknesses of 0.4 mm or larger is attached to the metal plate on the front side or the metal plate on the rear side.

11. The electronic component module according to claim 9, wherein at least one of a leadframe, a heat sink, and a cooling fin having thicknesses of 0.4 mm or larger is attached to the metal plate on the front side or the metal plate on the rear side, and a warp amount of the silicon nitride substrate in the long-side direction and a warp amount of the silicon nitride substrate in the short-side direction are both less than 0.1 mm (0 mm included).

12. The electronic component module according to claim 9, wherein the electronic component module is subjected to resin sealing by a transfer molding method.

13. The electronic component module according to claim 9, wherein continuity with the electronic component dispenses with wire bonding.

* * * * *